United States Patent [19]
Fujihira

[11] Patent Number: 5,159,516
[45] Date of Patent: Oct. 27, 1992

[54] OVERCURRENT-DETECTION CIRCUIT

[75] Inventor: Tatsuhiko Fujihira, Matsumoto, Japan

[73] Assignee: Fuji Electric Co., Ltd., Japan

[21] Appl. No.: 819,408

[22] Filed: Jan. 10, 1992

[30] Foreign Application Priority Data

Mar. 14, 1991 [JP] Japan ................................ 3-48499

[51] Int. Cl.$^5$ ............................................. H02H 7/10
[52] U.S. Cl. ..................................... 361/18; 323/315
[58] Field of Search ................. 361/18, 91; 323/315, 323/312, 277

[56] References Cited

U.S. PATENT DOCUMENTS 4,703,390 10/1987 Fay et al. ............................ 361/101
5,027,251 6/1991 Hirota et al. .......................... 361/18

Primary Examiner—Todd E. DeBoer
Attorney, Agent, or Firm—Brumbaugh, Graves, Donohue & Raymond

[57] ABSTRACT

An improved overcurrent-detection circuit for detecting overcurrent condition of a main current flowing through a semiconductor power device uses a constant-current device to provide a proportionally enhanced potential difference representative of increases in such current. The proportionally enhanced potential difference increases the accuracy of measuring the current flowing between first and second main-current terminals of the semiconductor power device, thereby providing more accurate overcurrent detection, without requiring an increase in the accuracy of a voltage comparator. The power semiconductor device is coupled to a current-mirror element having a shunt-current terminal. The overcurrent-detection circuit incorporates a constant-current device connected between the second main-current terminal and the shunt-current terminal. The constant-current device maintains the shunt current at a substantially constant level, after the shunt current rises to a predetermined level. The overcurrent-detection circuit also incorporates determining means, which is coupled across the constant-current device and includes a voltage comparator. The voltage comparator provides an overcurrent-detection signal when the potential difference across the constant-current device exceeds a predetermined voltage. The overcurrent-detection signal is used to control the main current of the semiconductor power device. The present invention provides an overcurrent-detection circuit with superior overcurrent-detection accuracy using conventional power-IC manufacturing technology.

15 Claims, 3 Drawing Sheets

OVERCURRENT-DETECTION CIRCUIT

FIELD OF THE INVENTION

The present invention relates to an overcurrent-detection circuit to be used in conjunction with a power semiconductor device, and more particularly to an overcurrent-detection circuit incorporated on a single chip with a power semiconductor device and its control circuit.

BACKGROUND OF THE INVENTION

Power semiconductor devices, such as power bipolar transistors, power MOSFET, and IGBT, are typically utilized to control high voltages and large currents involved in switching such devices as power sources, solenoids, lamps, motor-controlling inverters, and DC-motor switches. These power semiconductor devices have a "safe operation area" (SOA) that corresponds to the magnitude and conduction time of output currents. If a current exceeding the SOA flows for an extended period of time, the power semiconductor devices overheat and thermally breakdown.

In order to prevent such overcurrent conditions, the power semiconductor devices incorporate a protection device to monitor the output current and temperature of the power semiconductor devices. The protection device limits or interrupts the current flow in the case of an overcurrent or overheating condition.

FIG. 4 shows a circuit diagram of an integrated circuit incorporating a conventional overcurrent-protection circuit. An n-channel power MOSFET (1), used as a power semiconductor device, is connected with a current-mirror element (2) acting as a current sensor. The drains of both the power MOSFET (1) and the current-mirror element (2) are connected in parallel to a common, first main-current terminal. The gates of both elements are connected in parallel to a common control terminal (5).

The source of the power MOSFET (1) is connected to a second main-current terminal (4). The source of the current-mirror element (2) is connected to a shunt-current terminal (6).

The first main-current terminal (3) is connected to the higher-potential side of a power source (8) via load (7). The second main-current terminal (4) is connected to the lower-potential side of the power source (8). The power source (8) supplies the main current, I, to the power MOSFET (1) via the load (7). A control signal sent from a drive circuit (9) to the control terminal (5) controls the main current.

The overcurrent-detection element (11), shown in FIG. 4, consists of a detection resistor (12) connected between the second main-current terminal (4) and the shunt-current terminal (6), a constant-voltage device (13), and a comparator (14) connected between the lower-potential side of the constant-voltage device and the shunt-current terminal. A shunt current, i, shunted from the main current at a predetermined ratio by the current-mirror element (2), flows across the detection resistor (12). The constant-voltage device (13), connected between the second main-current terminal (4) and the comparator (14), generates a predetermined, threshold voltage, $E_s$. The comparator (14), connected between the positive side of the constant-voltage device (13) and the shunt-current terminal (6), compares the potential difference across the resistor (12) with the threshold voltage, $E_s$. The output of the comparator (14) is transmitted to the control terminal (5) via a control circuit (10) and the drive circuit (9).

In a circuit, such as one shown in FIG. 4, combining an overcurrent-detection circuit with a power MOSFET, the amount of the main current, I, can be ascertained by measuring the potential difference, E, across the detection resistor (12). Measurement of the main current is possible because the ratio of the shunt current, i, flowing into the current-mirror element (2), relative to the main current, is predetermined.

FIG. 5 is a characteristic graph showing the relationship between the shunt current, i, and the potential drop across the detection resistor, for the circuit shown in FIG. 4. It is understood that, for the purposes of the circuit shown in FIG. 4, the ratio i/I is equal to 1/10,000, and the resistance value of the detection resistor (12) is 500 Ω.

In the figure, assuming the upper limit of the main-current value in the SOA to be 2A, the main current at the SOA can be determined to be 2A by finding the point, P1, on the curve which corresponds with the shunt-current value of 200 μA and the inter-terminal potential difference of 0.1 V between the shunt-current terminal and the second main-current terminal. Consequently, if the threshold voltage $E_s$ of the constant-voltage device (13) has been set to 0.1 V, one can identify the main current as having reached an overcurrent state when the comparator determines that the inter-terminal potential difference, E, exceeds the threshold voltage of 0.1 V.

As a result of incorporating the overcurrent-detection element, overheating and breakdown failure of a power MOSFET can be prevented by appropriately adjusting the main-current flow to the output signal of the comparator. An overcurrent-detection signal, $V_o$, is transmitted to the control circuit (10) whenever the comparator satisfies the condition of $E - E_2 > 0$. Based on the overcurrent-detection signal, $V_o$, the control circuit (10) controls via the drive circuit (9) the voltage at the control terminal (5), thereby performing a protective operation of either limiting or interrupting the main current, I.

If the entire circuit shown in FIG. 4 could be integrated on a single chip with the use of conventional technology, there would be a great economic advantage. However, even if such integration is possible, the inherent variance or production tolerance as affecting the accuracy of the comparator, in responding to the offset voltage applied to ascertain whether an overcurrent condition exists, will greatly affect the overcurrent-detection performance of the overcurrent-detection circuit.

The variance or tolerance of a comparator made in a conventional manufacturing process suitable for production of power IC, in responding to the offset voltage, typically reaches ±10 mV. When this figure is converted to a variance in terms of detection accuracy of the detection or shunt current, i, in FIGS. 4 and 5, the variance is ±20μA. In other words, the variance or tolerance results in a determination error of ±10%.

If an attempt is made to use a comparator with less variance in responding to the offset voltage, such comparator will not be compatible with the tolerance inherent in the conventional power-IC production process. Manufacturing such a comparator to closer tolerances, for example, in a separate production process involving separate chips for the power IC and comparator, will be an economic burden.

In attempting to find a way to reduce the effect of the variance of a comparator in responding to the offset voltage so as to permit satisfactory detection accuracy with a single chip, one method which might be considered might involve raising the resistance value of the detection resistor (12) and increasing the inter-terminal voltage drop due to the shunt current, i. However, increasing the resistance will affect the shunt ratio of the shunt current, i, relative to the main current, I, thereby preventing improvement in accuracy of overcurrent determination.

SUMMARY OF THE INVENTION

In order to solve the above problem, the present invention provides an overcurrent-detection circuit that can minimize the effect of comparator variance or tolerance on the accuracy of overcurrent determination, even if a comparator utilized in the circuit has a variance or tolerance determined by manufacturing tolerances such as satisfactory in the production of power ICs. Thus, the present invention is intended to enable production of an overcurrent-detecting circuit on the same chip with a power IC, with manufacturing tolerances that match the tolerances of the conventional, power-IC manufacturing processes.

More particularly, the overcurrent-detection circuit is arranged to detect an overcurrent condition in the main current of a power semiconductor device based on the potential difference across a constant-current means, which is arranged so as to provide a higher rate of change of voltage drop with increased current flow in the power device to be monitored. With a higher rate of voltage change, the effect of comparator error is reduced. If, for example, a given current increase produced a voltage change twice as large as previously, the measurement error of a given comparator would be reduced in half, providing increased control accuracy.

The power semiconductor device is disposed with first and second main-current terminals to permit the main current to flow and a control terminal for controlling the main current. The power semiconductor device is coupled to a current-mirror device, which device has first terminal connected in common with said first main-current terminal, a control terminal connected in common with said control terminal of said semiconductor power device, and a shunt-current terminal to conduct a shunt current that is small relative to said main current.

The overcurrent-detection circuit is disposed with constant-current means connected between said second main-current terminal and said shunt-current terminal. The constant-current means maintains a shunt current through said constant-current means at a substantially constant level, after said shunt current rises to a predetermined level.

The circuit is also disposed with determining means coupled across said constant-current means. The determining means is responsive to changes in voltage drop across said constant-current means, thereby providing an overcurrent-detection signal when the voltage drop across said constant-current means exceeds a predetermined voltage.

The constant-current means may be a depletion-type MOSFET having a gate terminal and a source terminal connected in common with the second main-current terminal, and also having a drain terminal connected in common with the shunt-current terminal. Alternatively, the constant-current means may be an enhancement-type MOSFET connected to a gate-bias circuit. In this arrangement, the source terminal of said enhancement-type MOSFET is connected in common with the second main-current terminal, the drain terminal is connected in common with the shunt-current terminal, and the gate terminal is connected to the gate-bias circuit.

The determining means typically consists of a constant-voltage device and a comparator. The constant-voltage device is connected between the second main-current terminal and the comparator, and it generates a predetermined threshold voltage. The comparator compares the voltage drop across said constant-current means to the predetermined threshold voltage, whereby the comparator determines whether the main current has reached an overcurrent state. When the voltage drop across the constant-current means exceeds the predetermined threshold voltage, the comparator generates a detection signal.

In the present invention, after the shunt current rises to a predetermined level, the constant-current device suppresses proportional increase of the shunt current as the main current increases. As a result, with the current held substantially constant, the voltage across the constant-current device is caused to increase at a substantially increased rate, as compared to the voltage increase across the detection-resistor (12) in the prior-art circuit of FIG. 4. Consequently, the effects of the variance or tolerance of the comparator on the accuracy of overcurrent determination is reduced in significance as the potential difference across the constant-current means increases beyond the predetermined threshold voltage. In addition, the degree of variance or tolerance of the comparator in responding to the offset voltage can be allowed to be determined by the conventional power-IC manufacturing process, without compromising the accuracy in overcurrent determination.

If the constant-current means utilizes a depletion-type MOSFET having a gate terminal and a source terminal connected in common with the second main-current terminal, and a drain terminal connected in common with the shunt-current terminal, it is easy to maintain the shunt current constant in a region beyond the MOSFET's pinch-off voltage. Consequently, the effects of variance or tolerance of the comparator in responding to offset voltage can be reduced. Furthermore, one can easily form via a conventional power-IC manufacturing process an overcurrent-detection circuit integrated on a single chip with a power semiconductor device.

If the constant-current means utilizes an enhancement-type MOSFET connected to a gate-bias circuit, the gate-bias circuit can maintain the gate voltage of the enhancement-type MOSFET constant. Furthermore, the temperature dependence of overcurrent-detection accuracy, resulting from temperature changes in circuit elements, can be corrected.

In both embodiments of the present invention, significance of the variance or tolerance as affecting the accuracy of the comparator in responding to the offset voltage is minimized by the constant-current means. Furthermore, a comparator having the inherent tolerances of conventional power-IC manufacturing process can be used in the overcurrent-detection circuit, without compromising the overcurrent-detection performance.

DETAILED DESCRIPTION OF THE INVENTION

Figure 1:
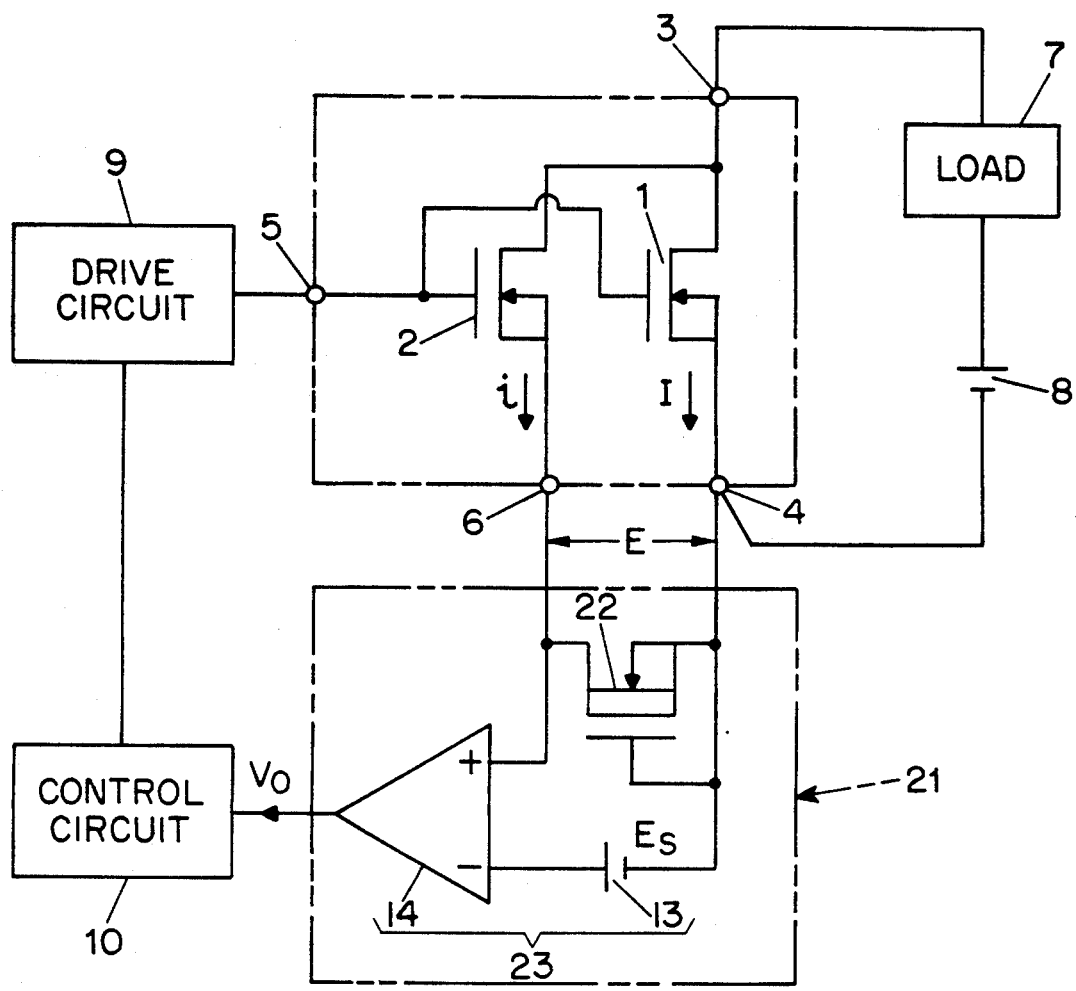
FIG. 1 is a circuit diagram of an overcurrent-detection circuit according to one embodiment of the present invention.

FIG. 1 shows a circuit diagram of an overcurrent-detection circuit according to one embodiment of the present invention. In FIG. 1, an overcurrent-detection circuit (21) consists of a constant-current device (22) and a determining means (23).

The constant-current device in FIG. 1 is a depletion-type MOSFET. The MOSFET has a drain terminal connected in common with a shunt-current terminal (6) of a current-mirror element (2), and a source terminal and a gate terminal connected in common with a second main-current terminal (4) of the power MOSFET (1).

The determining means (23) consists of a comparator (14) and a constant-voltage device (13). The shunt-current terminal (6) is connected to the positive-input terminal of the comparator, and the constant-voltage device (13) is connected between the second main-current terminal (4) and the negative-input terminal of the comparator. The comparator (14) compares the potential difference across the constant-current device, E, with a predetermined threshold voltage, $E_s$, of the constant-voltage device. The comparator (14) generates an overcurrent-detection signal when E exceeds $E_s$. The signal is sent to a control circuit (10) controlling the voltage at a control terminal (5), thereby controlling the overcurrent.

Figure 2:
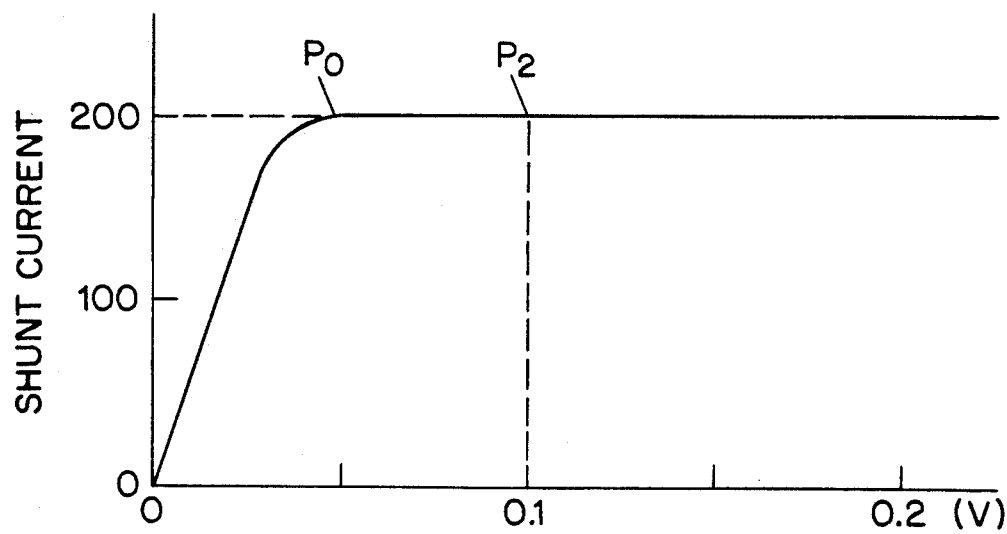
FIG. 2 is a characteristic current-voltage curve illustrating the operation of the overcurrent-detection circuit according to the embodiment shown in FIG. 1.

FIG. 2 shows a characteristic current-voltage curve illustrating the operation of the constant-current device (22) in the overcurrent-detection circuit (21) shown in FIG. 1. The constant-current device (22) is a depletion-type MOSFET which maintains the shunt current, i, constant in the curve region beyond the pinch-off voltage, $P_o$.

Figure 4:
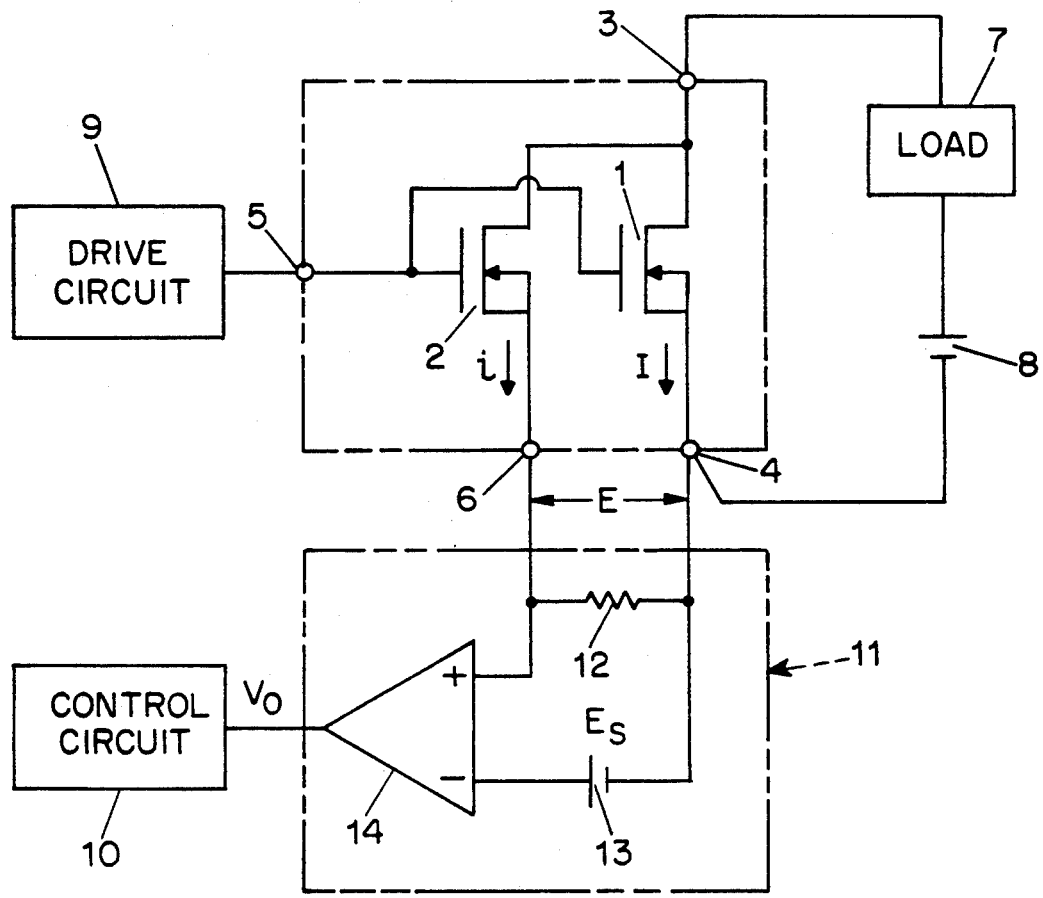
FIG. 4 is a circuit diagram of a conventional overcurrent-detection circuit.
Figure 5:
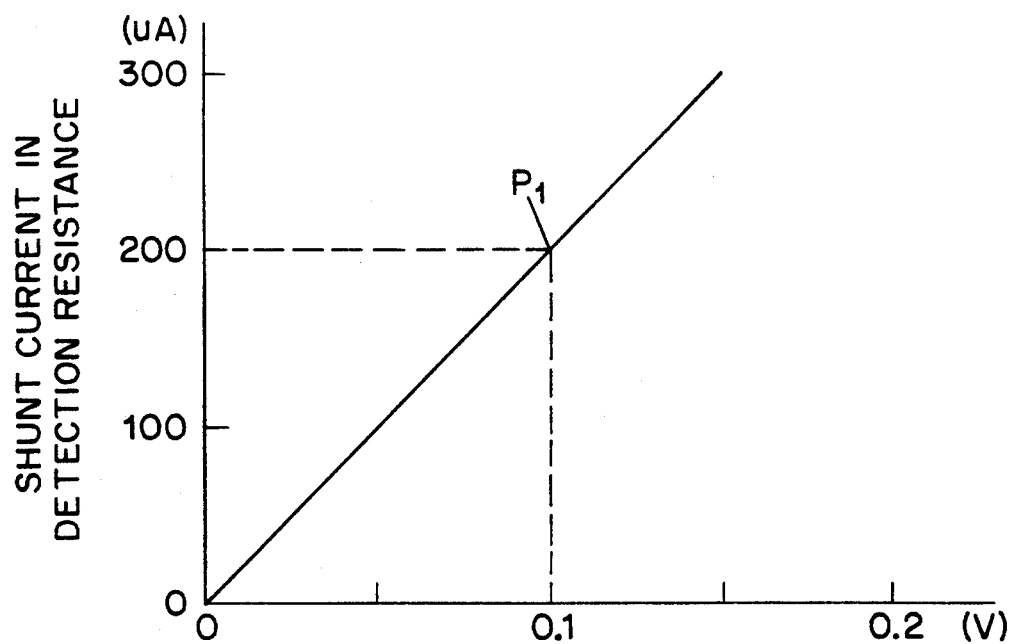
FIG. 5 is a characteristic current-voltage curve illustrating the operation of the conventional overcurrent-detection circuit shown in FIG. 4.

In FIG. 2, point P2 is defined such that it corresponds to the potential difference, E, of 0.1 V across the constant-current device when the shunt current, i, is 200 μA. An equivalent resistance between the shunt-current terminal and the second main-current terminal, then, can be regarded as being equivalent to the resistance of the detection resistor (12), 500 Ω, incorporated in the conventional overcurrent-detection circuit of FIG. 4. As previously mentioned, it is understood that, for the purposes of FIG. 4, the constant-voltage source (13) generates a threshold voltage of 0.1 V. Consequently, the main current of the circuit shown in FIG. 2 can be controlled by a comparator (14) that compares the potential difference, E, across the constant-current device (22) with the threshold voltage, $E_s$. The comparator transmits an overcurrent-detection signal, $V_o$, to the control circuit (10) when E exceeds $E_s$.

If the main current flowing into the power MOSFET increases, the shunt current, i, will have tendency to increase proportionally. However, because the constant-current device (22) maintains the shunt current constant, the equivalent resistance across the constant-current device increases with the increase in the main current. Consequently, while the potential difference, E, across the constant-current device (22) increases as a result of the generated overcurrent, the variance or the tolerance of the comparator (14) in responding to the offset voltage does not change.

Furthermore, the rate of increase of the potential difference, E, across the constant-current device (22) in FIG. 2 is generally greater than the rate at which the shunt current, i, attempts to increase. With a given current increase now represented by a proportionally larger increase in potential difference, E, the inaccuracy of comparator (14) has proportionally less effect. Consequently, the accuracy of determining means (23) is increased despite the accuracy of the comparator (14) remaining unchanged.

Overcurrent-detection tests were performed on 200 power IC's incorporating power MOSFETs with the overcurrent-detection circuit of FIG. 2, a control circuit, and a drive circuit. The ratio of standard deviation to the mean value of the overcurrent measurements was compared with the ratio obtained from the conventional circuit shown in FIG. 4. The resulting overcurrent-detection tolerance value for the embodiment of FIG. 2 was approximately 3%, while the tolerance value for the conventional circuit was approximately 7%.

Furthermore, the tests proved that integration of the overcurrent-detection circuit shown in FIG. 2 was possible via conventional power-IC manufacturing process, thereby resulting in economic benefits.

Figure 3:
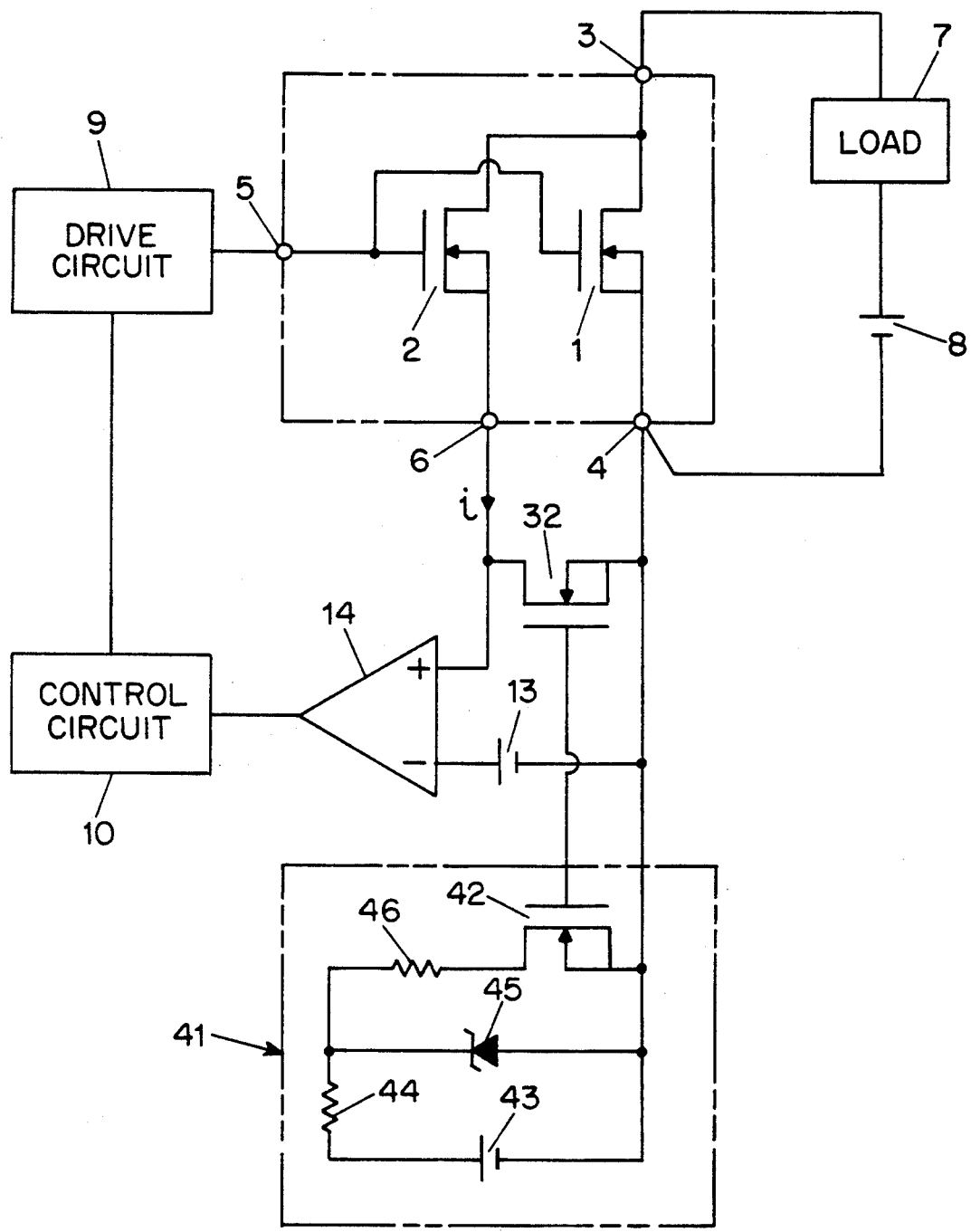
FIG. 3 is a circuit diagram of an overcurrent-detection circuit according to another embodiment of the present invention.

FIG. 3 is a circuit diagram of another embodiment according to the present invention. It differs from the embodiment of FIG. 2 in that the constant-current device (32) is an enhancement-type MOSFET. The drain terminal of this first enhancement-type MOSFET is connected to a shunt-current terminal (6), and the source terminal is connected to a second main-current terminal (4) of a power MOSFET (1). The gate terminal of first enhancement-type MOSFET is connected to the gate terminal of second enhancement-type MOSFET (42) incorporated in a gate-bias circuit (41).

The gate-bias circuit (41) consists of second enhancement-type MOSFET (42), a constant-voltage source (43), a Zener diode (45), and resistors (44) and (46). The gate-bias circuit (41) maintains the shunt current constant by detecting the change in the shunt current, i, flowing between the gate and source of first enhancement-type MOSFET (32), which change is reflected as the change in the gate-bias voltage of second enhancement-type MOSFET. Furthermore, the temperature dependence of the shunt current associated with the temperature changes in the circuit elements can be corrected by incorporating the gate-bias circuit.

Both embodiments of the present invention provide overcurrent-detection performance with a smaller margin of error (i.e., improved accuracy) as compared to the conventional overcurrent-detection circuit. Consequently, no determining means involving a more accurate, higher cost comparator is required, and an overcurrent-detection circuit with excellent overcurrent-detection accuracy can be provided more economically and advantageously.

The embodiment of the present invention incorporating an enhancement-type MOSFET has an additional advantage. This embodiment corrects the temperature dependence of the overcurrent resulting from temperature changes in the circuit elements, by providing a second enhancement-type MOSFET which is subject to offsetting temperature effects.

The embodiments described above were explained in terms of application to a low-side-switching type circuit, in which a load (7) is connected to the higher-potential side of the power source (8), and the power semiconductor device is connected to the lower-potential side of the power source. However, the present invention should not be limited to above applications. The present invention can also be applied to a high-side-switching type circuit or a bridge-type circuit.

Although the embodiments described above incorporated an N-channel power MOSFET, an overcurrent-detection circuit according to the present invention can also be applied to a P-channel power MOSFET. In addition, the present invention can be also applied to IGBTs and power bipolar transistors.

I claim:

1. An overcurrent-detection circuit comprising:
   a semiconductor power device having first and second main-current terminals and a control terminal, which semiconductor power device is subject to damage from an overcurrent;
   a current-mirror device having a first terminal connected in common with said first main-current terminal, a control terminal connected in common with said control terminal of said semiconductor power device, and a shunt-current terminal, and arranged for conducting a shunt current between said first terminal and shunt-current terminal of said current-mirror device when current flows between said first and second main-current terminals;
   constant-current means connected between said second main-current terminal and said shunt-current terminal for maintaining a shunt current through said constant-current means at a substantially constant level, after said shunt current rises to a predetermined level; and
   determining means, coupled across said constant-current means and responsive to changes in voltage drop across said constant-current means, for providing an overcurrent-control signal when the voltage drop across said constant-current means exceeds a predetermined voltage;
   whereby, said overcurrent-control signal may be used to control said semiconductor power device to avoid damage from overcurrents.

2. A device according to claim 1 further comprising:
   drive-circuit means, coupled to said control terminal of said semiconductor power device, for determining current flow through said device; and
   control-circuit means, responsive to said overcurrent-control signal, for coupling semiconductor-power-device shut-off signals to said drive-circuit means.

3. A device according to claim 1, wherein said semiconductor power element is a power MOSFET.

4. A device according to claim 1, wherein said constant-current means is a depletion-type MOSFET having source and gate terminals coupled to said second main-current terminal and a drain terminal coupled to said shunt-current terminal.

5. A device according to claim 1, wherein said determining means comprises:
   constant-voltage means for generating a predetermined reference voltage; and
   comparator means for comparing said voltage drop across said constant-current means to said reference voltage;
   whereby said comparator means generates said overcurrent-control signal when the voltage drop across said constant-current means exceeds said reference voltage.

6. A device according to claim 5 further comprising:
   drive-circuit means, coupled to said control terminal of said semiconductor power device, for determining current flow through said device; and
   control-circuit means, responsive to said overcurrent-control signal, for coupling semiconductor-power-device shut-off signal to said drive-circuit means.

7. A device according to claim 5, wherein said constant-current means is a depletion-type MOSFET having source and gate terminals coupled to said second main-current terminal and a drain terminal coupled to said shunt-current terminal.

8. An overcurrent-detection circuit comprising:
   a semiconductor power MOSFET having drain, source and gate terminals:
   a current-mirror device having a drain terminal connected in common with said power-MOSFET drain terminal, a gate terminal connected in common with said power-MOSFET gate terminal, and a shunt-current terminal, said current-mirror device arranged for conducting a shunt current between said drain terminal and said shunt-current terminal when current flows between said drain and source terminals of said power MOSFET:
   a depletion-type MOSFET having source and gate terminals connected in common with said source terminal of said power MOSFET, and a drain terminal connected in common with said shunt-current terminal, said depletion-type MOSFET arranged as a constant-current device for maintaining a shunt current through said depletion-type MOSFET at a substantially constant level, after said shunt current rises to a predetermined level;
   determining means, including a constant-voltage device and a comparator coupled in series across said depletion-type MOSFET for providing an overcurrent signal when the voltage drop across said constant-current device exceeds a predetermined voltage generated by said constant-voltage device;
   a drive circuit, coupled to said gate terminal of said power MOSFET, for determining current flow through said power MOSFET; and
   a control circuit, coupled to said drive circuit, for generating an overcurrent-control signal responsive to said overcurrent signal and coupling said overcurrent-control signal to said drive circuit;
   whereby said overcurrent-control signal may be used to control said power MOSFET to avoid damage from overcurrents.

9. An overcurrent-detection circuit comprising:
   a semiconductor power device having first and second main-current terminals and a control terminal, which semiconductor power device is subject to damage from an overcurrent;
   a current-mirror device having a first terminal connected in common with said first main-current terminal, a control terminal connected in common with said control terminal of said semiconductor power device, and a shunt-current terminal, and arranged for conducting a shunt current between said first terminal and shunt-current terminal of said current-mirror device when current flows between said first and second main-current terminals;

constant-current means, comprising a first enhancement-type MOSFET having a source terminal coupled to said second main-current terminal, a drain terminal coupled to said shunt-current terminal and a gate terminal, for maintaining a shunt current through said constant-current means at a substantially constant level, after said shunt current rises to a predetermined level;

determining means, coupled across said constant-current means and responsive to changes in voltage drop across said constant-current means, for providing an overcurrent-control signal when the voltage drop across said constant-current means exceeds a predetermined voltage; and a gate-bias circuit, coupled across said constant-current means, including:

a second enhancement-type MOSFET having source and gate terminals respectively coupled to said source and gate terminals of said first enhancement-type MOSFET, and a drain terminal;

a zener diode coupled across said source and drain terminals of said second enhancement-type MOSFET; and a constant-voltage source coupled across said zener diode;

whereby, said overcurrent-control signal may be used to control said semiconductor power device to avoid damage from overcurrents and said gate-bias circuit introduces temperature-dependent operating variations which tend to offset such Variations inherently affecting operation of said constant-current means.

10. A device according to claim 9 further comprising:
drive-circuit means, coupled to said control terminal of said semiconductor power device, for determining current flow through said device; and
control-circuit means, responsive to said overcurrent-control signal, for coupling semiconductor-power-device shut-off signals to said drive-circuit means.

11. A device according to claim 9, wherein said semiconductor power element is a power MOSFET.

12. A device according to claim 9, wherein said determining means comprises:
constant-voltage means for generating a predetermined reference voltage; and
comparator means for comparing said voltage drop across said constant-current means to said reference voltage;
whereby said comparator means generates said overcurrent-control signal when the voltage drop across said constant-current means exceeds said reference voltage.

13. A device according to claim 9, wherein said gate-bias circuit comprises:
a second enhancement-type MOSFET having a gate terminal connected to said gate terminal of said constant-current means, a source terminal connected to an input terminal of a zener diode, and a drain terminal connected via a resistor to an output terminal of said zener diode; and a constant-voltage source having its lower-potential side connected to said source terminal of said second enhancement-type MOSFET, and its higher-potential side connected via a resistor to said output terminal of said zener diode.

14. A device according to claim 12 further comprising:
drive-circuit means, coupled to said control terminal of said semiconductor power device, for determining current flow through said device; and
control-circuit means, responsive to said overcurrent-control signal, for coupling semiconductor-power-device shut-off signals to said drive-circuit means.

15. An overcurrent-detection circuit comprising:
a semiconductor power MOSFET having drain, source and gate terminals:
a current-mirror device having a drain terminal connected in common with said power-MOSFET drain terminal, a gate terminal connected in common with said power-MOSFET gate terminal, and a shunt-current terminal, said current-mirror device arranged for conducting a shunt current between said drain terminal and said shunt-current terminal when current flows between said drain and source terminals of said power MOSFET:

a first enhancement-type MOSFET having a source terminal connected in common with said power-MOSFET source terminal, a drain terminal connected in common with said shunt-current terminal, and a gate terminal, said enhancement-type MOSFET arranged as a constant-current device for maintaining a shunt current through said enhancement-type MOSFET at a substantially constant level, after said shunt current rises to a predetermined level;

determining means, including a constant-voltage device and a comparator coupled in series across said enhancement-type MOSFET, for providing an overcurrent signal when the voltage drop across said constant-current means exceeds a predetermined voltage generated by said constant-voltage device;

a drive circuit, coupled to said gate terminal of said power MOSFET, for determining current flow through said power MOSFET;

a control circuit, coupled to said drive circuit, for generating an overcurrent-control signal responsive to said overcurrent signal and coupling said overcurrent-control signal to said drive circuit; and a gate-bias circuit, coupled across said first enhancement-type MOSFET, including:
a second enhancement-type MOSFET having source and gate terminals respectively coupled to said source and gate terminals of said first enhancement-type MOSFET, and a drain terminal;
a zener diode coupled across said source and drain terminals of said second enhancement-type MOSFET; and
a constant-voltage source coupled across said zener diode;
whereby said overcurrent-control signal may be used to control said power MOSFET to avoid damage from overcurrents and said gate-bias circuit introduces temperature-dependent operating variations which tend to offset such variations inherently affecting operation of said first enhancement-type MOSFET.

* * * * *